United States Patent
Gueguen

(10) Patent No.: US 7,027,521 B2
(45) Date of Patent: Apr. 11, 2006

(54) DIGITAL TRANSMISSION METHOD OF THE ERROR CORRECTING CODING TYPE

(75) Inventor: Arnaud Gueguen, Rennes (FR)

(73) Assignee: Mitsubishi Denki Nabushiki Kaisha, Tokyo (JP)

( * ) Notice: Subject to any disclaimer, the term of this patent is extended or adjusted under 35 U.S.C. 154(b) by 794 days.

(21) Appl. No.: 09/777,876

(22) Filed: Feb. 7, 2001

(65) Prior Publication Data

US 2002/0013922 A1    Jan. 31, 2002

(30) Foreign Application Priority Data

Feb. 14, 2000   (FR) ................................. 00 01984

(51) Int. Cl.
   *H04L 23/02* (2006.01)
   *H04L 5/12* (2006.01)
   *H03M 13/00* (2006.01)
   *H03M 13/03* (2006.01)

(52) U.S. Cl. ...................... 375/265; 375/262; 375/341; 714/755; 714/758; 714/786

(58) Field of Classification Search ................ 375/259, 375/262, 265, 285, 340, 341; 714/746, 751, 714/752, 755, 758, 786, 792, 794, 795
See application file for complete search history.

(56) References Cited

U.S. PATENT DOCUMENTS

| 5,446,747 | A | 8/1995 | Berrou | 714/788 |
|---|---|---|---|---|
| 5,761,248 | A | 6/1998 | Hagenauer et al. | 375/340 |
| 5,907,582 | A * | 5/1999 | Yi | 375/259 |
| 5,983,385 | A | 11/1999 | Khayrallah et al. | 714/755 |
| 6,182,261 | B1 * | 1/2001 | Haller et al. | 714/758 |
| 6,233,709 | B1 * | 5/2001 | Zhang et al. | 714/774 |
| 6,272,183 | B1 * | 8/2001 | Berens et al. | 375/262 |
| 6,615,385 | B1 * | 9/2003 | Kim et al. | 714/758 |
| 6,876,709 | B1 * | 4/2005 | Kim et al. | 375/341 |
| 6,879,648 | B1 * | 4/2005 | Ebel, Sr. | 375/340 |
| 6,888,897 | B1 * | 5/2005 | Nazari et al. | 375/262 |
| 6,898,254 | B1 * | 5/2005 | Wolf et al. | 375/340 |

FOREIGN PATENT DOCUMENTS

WO       WO 9911009 A1 *   3/1999

* cited by examiner

*Primary Examiner*—Betsy L. Deppe
(74) *Attorney, Agent, or Firm*—Oblon, Spivak, McClelland, Maier & Neustadt, P.C.

(57) ABSTRACT

A digital transmission method with error correcting coding includes a coding procedure and a decoding procedure in order to correct transmission errors. The coding procedure includes a plurality of elementary coding steps operating in parallel or in series. The decoding procedure is iterative and includes, for each iteration, a plurality of elementary decoding steps which correspond to the plurality of elementary coding steps. Each elementary decoding step generates at least one weighted output information item. A characteristic quantity is generated directly from a set of weighted output information items generated by each elementary decoding step for processing a decoding sequence. A comparison step is adapted to compare the characteristic quantity with a threshold quantity determined by a threshold quantity determination step. An interrupt step interrupts the iterative decoding procedure at the elementary decoding step when the characteristic quantity reaches the threshold quantity.

24 Claims, 4 Drawing Sheets

DIGITAL TRANSMISSION METHOD OF THE ERROR CORRECTING CODING TYPE

FIELD OF THE INVENTION

The present invention concerns in general terms a digital transmission method of the error correcting coding type, notably for a system for digital transmission over a channel with a large amount of interference. More precisely, it concerns the interruption of the iterative decoding of a digital transmission method of the error correcting coding type using coding schemes of the turbo code type.

BACKGROUND OF THE INVENTION

A digital transmission system conveys information using a physical carver such as cable, optical fibre or propagation on a radio channel, satellite or otherwise. Such a physical medium will be referred to as a channel. Generally, such a system comprises in particular, on the sending side, a device referred to as a channel coder and, on the receiving side, a corresponding decoding device.

The channel coding device has a so-called error correcting coding function. The error correcting coding function consists of generating redundant information on sending which, during decoding at the destination, will make it possible to reconstitute the useful information transmitted, using the information arriving at its destination, referred to as the received information, affected by the disturbance occurring on the channel, notably of the noise, attenuation and interference type. A digital transmission method using such a channel coding associated with a corresponding destination decoding is referred to as a transmission method of the error correcting coding type.

For example, the coding operation takes place at the level of the bit. This operation associates with a binary sequence of useful information a binary sequence of corresponding coded information. This binary sequence of coded information is referred to as the code word when the size of the binary sequences of useful information is fixed. The binary sequence of coded information is of greater size than the binary sequence of useful information so as to introduce redundancy. Because of this redundancy, only certain coded information sequences, in accordance with the coding law, are possible. If received information sequences to be decoded are different from these possible sequences, it is because they correspond to information impaired by the channel. The role of the decoding method will therefore be to reconstitute the useful information as well as possible from the received information sequence, knowing the coding law used. It is known how to decode the most simple codes in optimum fashion, that is to say by finding, amongst the possible sequences, the most likely sequence. For the more complex codes such as turbo codes, the limiting factor is in general the complexity of the decoder.

The performance of a transmission with error correcting coding is generally measured in terms of rate of binary errors or packets for a given signal to noise ratio $E_b/N_o$, where $E_b$ is the energy per information bit and $N_o$ is the power spectral density of the noise. A code is referred to as more or less efficient depending on whether its use affords a higher or lower error rate for a given ratio $E_b/N_o$ and for a given decoding complexity.

The efficiency of the code is the number of useful information bits per coded information bit.

Known error correcting codes are block codes. Block coding consists of associating with each block of k information bits a block of n bits (n>k) therefore containing (n−k) redundant bits. The block of n bits is obtained by multiplying the block of k useful bits by a matrix with k rows and n columns referred to as a generating matrix for the code. When, by permutation, the generating matrix is written in a form such that it reveals the identity matrix, so that, in the block of n bits, the k information bits and the n−k redundancy bits are separated, the code is said to be systematic. The efficiency of the code is equal to k/n. The decoding device detects the errors and corrects them by means of the minimum Hamming distance. Such error correcting codes well known in the art are for example Hamming codes, BCH codes and Reed-Solomon codes.

Effecting an error correcting coding by means of one or more convolutional codings is also well known. Their operating principle consists of coding a block of k binary elements present at the input of the coder as a block of n binary elements also taking account of m blocks preceding the block present in the input, using a device with a register of the shift register type. The output of the convolutional coder consists of n coded binary elements generated by the convolution product of the k binary elements present at the input with the response of the coder defined by n generator polynomials. The efficiency of the code is equal to k/n. The decoding device reconstructs the original data, for example by means of a decoding of the sequential type, a decoding according to the most likely symbol, or a decoding according to the most likely sequence, as described, for example, in the document "Digital Communications", by J. G. Proakis, which appeared in 1995 in a publication by MacGraw-Hill. For example, the Viterbi algorithm provides an optimum decoding according to the most likely sequence.

According to a variant of this type of code, coding is not effected by directly taking into account a series of m useful information items preceding the information to be coded, but by using a series of m auxiliary information items, stored in a device of the shift register type, each obtained by the mathematical combination of a useful information item and m auxiliary information items calculated previously. Such a convolutional code is said to be recursive. When, in addition, the useful information appears as it is amongst the n outputs of the coder alongside (n−1) coded information items or redundant information items, the resulting code is referred to as a recursive systematic convolutional code, or RSC code.

Associating different coders in order to increase the performance of the coding is also known. For example, the data coded by a first coder can supply a second coder. Decoding takes place symmetrically, commencing with the second code.

A high-performance type of combination of coders has been proposed, as described notably in the document "Near Shannon Limit Error-Correcting Coding and Decoding: Turbo-codes" by C. Berrou, A. Glavieux and P. Thitimajshima, which appeared in ICC-1993, Conference Proceedings, on pages 1064–1070. This type of combination of coders has given rise to a family of coding schemes known in the art as turbo codes. The term turbo codes will be given to error correcting codes based on the combination, referred to as concatenation, of several simple codes, referred to as elementary codes, with the intervention of permutation operations, referred to as interleavings, which modify the order of taking into account of the data by each of the simple codes. For example, one type of conventional interleaving, referred to as uniform interleaving, is obtained by means of an interleaving matrix in which the source data are introduced row by row and retrieved column by column. In general, in order to improve the performance, the turbo codes use non-uniform interleavings. Elementary codes means codes with an efficiency greater than or equal to 1, of the type described above. It may, for example, be a case of recursive systematic convolutional codes for convolutional turbo codes, Hamming block codes or BCH for block turbo codes. Different types of concatenation can be envisaged. In parallel concatenation, the same information is coded for each coder separately after having been interleaved. In serial concatenation, the output of each coder is coded by the following coder after having been interleaved. The term dimension of the turbo code refers to the number of elementary coders used for implementing this turbo code. A well known turbo coding scheme consists of a parallel concatenation of elementary codes of the recursive systematic convolutional (RSC) code, type. This turbo code is referred to by the term PCCC. Examples of turbo codes with serial concatenation are SCCCs which use elementary codes of the convolutional code type and block turbo codes which use elementary codes of the block code type.

Information coded by a turbo code can be decoded by an iterative method referred to as turbo decoding. An example of turbo decoding is given in the aforementioned document "Near Shannon Limit Error-Correcting Coding and Decoding: Turbo-codes", by C. Berrou, A. Glavieux and P. Thitimajshima, which appeared in ICC-1993, Conference Proceedings, on pages 1064–1070. In this example, it is a case of the turbo decoding of a turbo code with parallel concatenation. There are combined several elementary decoders with weighted inputs and outputs each corresponding to an elementary coder of the coding device. The weighted inputs and outputs are effected in terms of probabilities, likelihood ratios or log likelihood ratios. The weighted inputs and outputs are generally associated with each of the m-ary symbols at the input and output of the elementary coders, that is to say, for example, with bits if binary coders are used as elementary coders. The decoders work one after the other in the case of a type of turbo decoding referred to as serial turbo decoding, or simultaneously in a type of turbo decoding known as parallel turbo decoding. Intermediate concatenation schemes can also be envisaged. Interleavers and deinterleavers act as a function of the interleavings carried out at coding. They enable each decoder to take into account an information item which is presented in the same order as at the output and input of the corresponding coder. Each elementary decoder uses the available information which corresponds to the information at the input and output of the corresponding elementary coder. The available information used by the elementary decoder, referred to as a priori information, consists of an output of the step preceding the channel decoding, namely, in general, a demodulation step, and an information item generated by one or more previous elementary decoding steps. By virtue of this a priori information and knowing the coding law of the corresponding elementary coder, the elementary decoder generates an a posteriori information item which is an estimation of the greatest reliability of the input information. The additional information compared with the input information is referred to as extrinsic information. This extrinsic information is transmitted to the following elementary decoder, which will use it as a priori information after interleaving or deinterleaving, and possible combination. Each elementary decoding step therefore benefits at the input from a priori information whose quality is increased by the elementary decodings carried out during the previous elementary decoding steps. This extrinsic information depends on the redundant information introduced by the corresponding coder.

The method is iterative in that the extrinsic information calculated by the last decoder or decoders in the series is propagated back to the first decoder or decoders in the series. The exchange of extrinsic information takes place between elementary decoders within the same step, and from this step to the following step. Each new step therefore increases the reliability of the information generated at an output. After a certain number of iterations, the decoding process stagnates, whether or not it has converged towards the solution. A thresholding is applied in order to generate the decoded information.

Naturally, the term turbo decoding encompasses various concatenation schemes which can be envisaged, depending for example on the type of turbo coding implemented. For example, in the turbo decoding corresponding to a turbo code with serial concatenation, the elementary decoders being associated in the reverse order of the elementary coders, each elementary decoder receives two a priori weighted information items corresponding one to the output information from the corresponding elementary coder and the other to the input information of the corresponding elementary coder. This elementary decoder produces two a posteriori weighted information items, one corresponding to the output of the corresponding elementary coder, and which therefore becomes, at the time of a following iteration, after corresponding interleaving, the a priori input of a preceding elementary decoder, and the other corresponding to the input of the corresponding elementary coder, which therefore becomes, in the same iteration, after corresponding deinterleaving, the a priori input of a following elementary, decoder.

Whatever the case, the extrinsic information can always be defined as the additional information given by an elementary decoding associated with an elementary coding with respect to an a priori information item, acting at the input of the elementary decoding.

In addition, it is possible to use various types of algorithm for elementary decoders with weighted inputs and outputs. Elementary decoders use, for example, MAP, LogMAP and MaxLogMAP algorithms, also referred to as APP, LogAPP and MaxLogAPP, which all derive from the calculation of a posteriori probabilities knowing a priori probabilities. Reference can be made, for a description of such decoding algorithms, for example, to the article "Optimal and sub-optimal maximum a posteriori algorithms suitable for turbo decoding" by P. Robertson, P. Hoeher and E. Villebrun, which appeared in European Trans. on Telecommun., vol. 8, March–April 1997, pages 119–125. It is also possible to use algorithms of the Viterbi algorithm type modified to associate, with each decision, a possible to use the SOVA (Soft Output Viterbi Algorithm). For block turbo codes, it is possible to use a Chase algorithm, as described in the article "A very low complexity block turbo decoder for product codes" by R. Pyndiah, P. Combelles and P. Adde, which appeared in IEEE Globecom 1996, pages 101 to 105.

It is also known that the efficiency of a code can be increased by a puncturing operation which consists of transmitting only certain bits of an information sequence, as described, for example, in the article "Rate-Compatible Punctured Convolutional (RCPC) codes and their application", by J. Hagenauer, which appeared in IEEE Trans., Vol. COM-36.4, 1988, pages 389–400 or in the article "New Rate Compatible Punctured Convolutional Codes for Viterbi Decoding", by L. H. C. Lee, which appeared in IEEE Trans., Vol. COM-42.2, 1994, pages 3073–3079. These non-transmitted bits are in general redundant information bits. This puncturing operation occurs at the sending level, after the coding operation. At the destination, a reciprocal operation of depuncturing is carried out before the decoding operation. The puncturing and depuncturing operations are defined by a puncturing matrix or diagram. The puncturing of redundant information bits reduces the correction capability of the code and increases its efficiency.

The error correcting codes of the family of turbo codes according to the state of the art described above make it possible to obtain a very high performance error correction whilst preserving sufficiently high efficiencies and allowing decoding operations of low complexity compared with the complexity of the code. Turbo decoding, sub-optimal in its principle, has a performance close to that of the optimal decoder and an appreciably lower complexity, since it is of the order of that of the decoding of the elementary codes.

However, the complexity of the turbo decoding and parameters such as the turbo decoding time or the energy consumption for turbo decoding can increase with a number of iterations of the turbo decoding procedure. There is then posed the problem of interruption of the turbo decoding. Naturally, a predetermined number of turbo decoding iterations can be fixed. However, it may happen then that this predetermined number of iterations is either insufficient, then not making it possible to achieve a satisfactory error correction, or too high, meaning that a certain number of iterations are unnecessary. This way of proceeding then takes place either to the detriment of the transmission performance, measured for example in terms of bit error rate, or to the detriment of the transmission conditions such as the complexity of the turbo decoding, the turbo decoding time or the consumption of energy for turbo decoding.

Generally, a maximum number of iterations is fixed corresponding to an acceptable complexity and/or maximum decoding time, and a stop criterion is used for interrupting the decoding process if this seems to have given rise to a convergence towards the useful information before the maximum number of iterations. Convergence can be detected in different ways. For example, an error detection code of the CRC (Cyclic Redundancy Check) type maybe used. If, during the decoding of an information sequence, the calculation of the error detecting code indicates that there are no more errors, the iterative decoding for the sequence is interrupted. A drawback of this method stems from the fact that an error detecting code must be introduced on transmission, which reduces the overall efficiency of the channel coder.

There have also been proposed criteria for the interruption of the turbo decoding based on a comparison of information sequences at the output of at least two successive elementary decoders. Such interruption criteria are described, for example, in an article by M. Moher whose title is "Decoding via Cross-Entropy Minimization", which appeared in "Proceedings of Globecom'93, IEEE Global Telecommunications Conference", vol. 2, pages 809–813, or in an article by R. Y. Shao, S. Lin and M. P. C. Fossorier entitled "Two simple stopping criteria for turbo-decoding", which appeared in "IEEE Transactions on Comm.", vol 47, No. 8, August 1999, pages 1117–1120. The use of such criteria for interruption of the turbo decoding is based notably on the fact that a stagnation of the outputs of the elementary decoders during the iterative decoding of a sequence of information indicates that additional decoding iterations will not further reduce the number of errors occurring on this information sequence.

Nevertheless, this type of turbo decoding interruption criterion poses two types of problem.

First of all, though the principle on which this criterion is based makes it possible, in a relatively simple manner, to control the stoppage of the decoding processing, it does not give any indication of the quality of the decoded information sequences, that is to say on the number of errors which they contain with respect to the useful information nor even on the possible presence of residual errors.

Next, the use of this type of interruption criterion assumes the storage of an information sequence issuing from a step which precedes the decoding step under consideration in order to carry out the comparison. Generally, it is even necessary to store several sequences issuing from steps preceding the step under consideration so that the functioning of the criterion is satisfactory.

Finally, since this interruption criterion is based on a stagnation of the outputs of successive elementary decoders, it detects the convergence of the decoding method at least one step after it has effectively converged. In the case of a convergence at the penultimate step of elementary decoding, the last step effected is therefore unnecessary.

BRIEF SUMMARY OF THE INVENTION

One object of the present invention is therefore to improve the interruption of the iterative decoding of a digital transmission method of the type with error correcting coding using coding schemes of the turbo code type. For this purpose, a criterion of interruption of the turbo decoding making it possible to resolve the problems mentioned above has been sought.

To this end, it proposes a digital transmission method of the type with error correcting coding, comprising, before a step of transmission over a channel, a coding procedure for generating, from a useful information item, a coded information item comprising at least one redundant information item and, after the said step of transmission over the said channel, a decoding procedure in order to obtain, from a received information item to be decoded, an estimation of said useful information item with correction of the transmission errors based on said at least one redundant information item, said coding procedure comprising a plurality of elementary coding steps associated with at least one interleaving step and operating in parallel or in series, said decoding procedure being iterative and comprising, for each iteration, a plurality of elementary decoding steps associated with interleaving and deinterleaving steps, corresponding to said plurality of elementary coding steps associated with said at least one interleaving step, each of said elementary decoding steps receiving a set of information to be decoded and generating a set of weighted output information items associated with a set of decoded information, the said method being characterised in that it comprises a step of determining a characteristic quantity adapted to calculate, for each of said elementary decoding steps, a quantity characteristic of the said set of weighted output information items, a comparison step adapted to compare the said characteristic quantity with a threshold quantity, and an interrupt step for interrupting said decoding procedure when said characteristic quality reaches the said threshold quantity.

Advantageously, the said characteristic quantity determination step is adapted to calculate, for each of the said elementary decoding steps, a quantity characteristic of a set of extrinsic information items corresponding to said set of weighted output information items associated with a set of decoded information.

It is in fact advantageous to calculate this characteristic quantity from the extrinsic information which makes it possible to give in a simple manner an indication of the number of errors remaining in a decoding sequence.

It will be understood that it is nevertheless possible to calculate a characteristic quantity directly from the weighted outputs in which, after a certain number of iterations, the extrinsic information becomes essential.

It has been determined that there exists a correlation between on the one hand the mean of the absolute value of the extrinsic information calculated on a sequence of N extrinsic values at the output of a given decoder during a given iteration, and on the other hand a number of errors remaining in the sequence of N decoded bits at the output of a given decoder for this given iteration. It is found that this mean increases rapidly as soon as the decoding of the sequence converges whilst it stagnates as long as this decoding does not converge. Thus, when this mean reaches a sufficient threshold quantity, there exists a high probability that the sequence does not contain any errors. It therefore becomes unnecessary to continue the decoding of this sequence.

It has been possible to establish curves, such as the one depicted in FIG. 3, showing, for different transmission conditions, expressed for example in terms of signal to noise ratio, the difference between the mean of the absolute value of the extrinsic information for badly decoded sequences and correctly decoded sequences.

Thus, advantageously, the characteristic quantity calculated by the said characteristic quantity determination step will be the mean of the absolute value of the extrinsic information item calculated on all the extrinsic information items considered. In this case, the interrupt step will interrupt the decoding procedure when the mean of the absolute value of the extrinsic information calculated by the characteristic quantity determination step is greater than an adapted threshold quantity.

However, this characteristic quantity can also be another statistical quantity characteristic of this set of extrinsic information items, such as its variance, its minimum or its maximum. It is also possible to use the sum of the absolute values of the extrinsic information items of this set of extrinsic information items.

Thus defined, the present invention applies to all types of transmission method using an error correcting coding of the turbo coding type and turbo decoding, whether it is a case of a turbo coding with serial or parallel concatenation, a turbo decoding with serial or parallel concatenation or mixed concatenation schemes.

According to another aspect of the present invention, the digital transmission method also comprises a threshold quantity determination step for determining a threshold quantity as a function of at least one configuration parameter.

A configuration parameter can be a parameter characterising the transmission conditions such as, for example, the signal to noise ratio. It can also be a case of a parameter characterising, for example, an elementary decoding algorithm, the size of the block of useful information, a type of quantities used, a maximum number of iterations, a type of transmission channel, etc. Naturally, in general, the threshold quantity determination step will determine a threshold quantity as a function of a plurality of configuration parameters.

This threshold quantity determination step can use an adaptive algorithm allowing the calculation of a threshold quantity as a function of one or more configuration parameters.

This threshold quantity determination step can also use pre-established reference tables making it possible to select a threshold quantity as a function of one or more configuration parameters.

According to another aspect of the present invention, the said threshold quantity determination step determines a threshold quantity so as to effect a compromise between the permitted performance for the said decoding procedure and the complexity of this decoding procedure.

For example, where the characteristic quantity chosen is the mean of the absolute value of the extrinsic information, the threshold quantity will be chosen on the one hand so as to be sufficiently large to ensure that the number of errors remaining in a decoded sequence is sufficiently low and on the other hand sufficiently small to limit the number of iterations necessary to achieve this threshold value.

In a similar manner, the said threshold quantity determination step determines a threshold quantity so as to ensure a certain quality of transmission.

For example, the said threshold quantity determination step determines a threshold quantity as a function of a mean transmission time required.

The said threshold quantity determination step can also determine a threshold quantity as a function of an acceptable mean energy consumption.

According to another aspect of the present invention, a maximum tolerable number of iterations having been predefined, the said threshold quantity determination step determines a threshold quantity by combining on the one hand a first quantity characteristic of a first set of extrinsic information generated by a last elementary decoder during a last iteration and associated with a first set of decoded information corresponding to the error-free decoding of a set of information to be decoded, and on the other hand a second quantity characteristic of a second set of extrinsic information generated by the said last decoder during the said last iteration and associated with a second set of decoded information corresponding to the decoding of the said set of information to be decoded in a case where errors remain.

Advantageously, the said first and second quantities will be the means of the absolute value of the extrinsic information calculated on, respectively, the said first set of extrinsic information and the said second set of extrinsic information.

However, these first and second quantities can also be any other statistical quantities characteristic of respectively these first and second sets of extrinsic information, such as their variances, their minima or their maxima. It is also possible to use the sums of the absolute values of the extrinsic information of, respectively, these first and second sets of extrinsic information.

The said first and second quantities can be determined, as a function of at least one configuration parameter, by means of an adaptive algorithm or a pre-established reference table. In practice, these first and second quantities will be established as a function of a plurality of configuration parameters.

The said threshold quantity can notably be the sum of the said first quantity multiplied by a coefficient $\alpha$ and the said second quantity multiplied by a coefficient $(1-\alpha)$, the coefficient $\alpha$ being chosen so as to be between 0 and 1.

Advantageously, this coefficient α will be chosen so as to effect a compromise between the performance permitted for the said decoding procedure and the complexity of this decoding procedure.

For example, where the characteristic quantity chosen is the mean of the absolute value of the extrinsic information, the coefficient α will be chosen on the one hand so as to be sufficiently large to ensure that the number of errors remaining in a decoded sequence is sufficiently low and on the other hand sufficiently low to limit the number of iterations performed by the decoding procedure.

In a similar manner, the coefficient α will be chosen so as to ensure a certain transmission quality.

For example, the coefficient α will be chosen as a function of a mean required transmission time.

The said coefficient α can also be chosen as a function of an acceptable mean energy consumption.

Advantageously, the coefficient α is determined by means of an adaptive algorithm or a pre-established reference table.

According to another aspect of the present invention, the said elementary decoding steps have inputs and outputs which are weighted, in terms of probabilities, likelihood ratios, or log likelihood ratios.

According to another aspect of the present invention, the said coding procedure comprises at least one puncturing step and the said decoding procedure comprises at least one corresponding depuncturing step.

BRIEF DESCRIPTION OF THE DRAWINGS

The characteristics of the invention mentioned above, as well as others, will emerge more clearly from a reading of the following description of an example embodiment, the said description being given in relation to the accompanying drawings, amongst which.

DETAILED DESCRIPTION OF THE INVENTION

Figure 1:
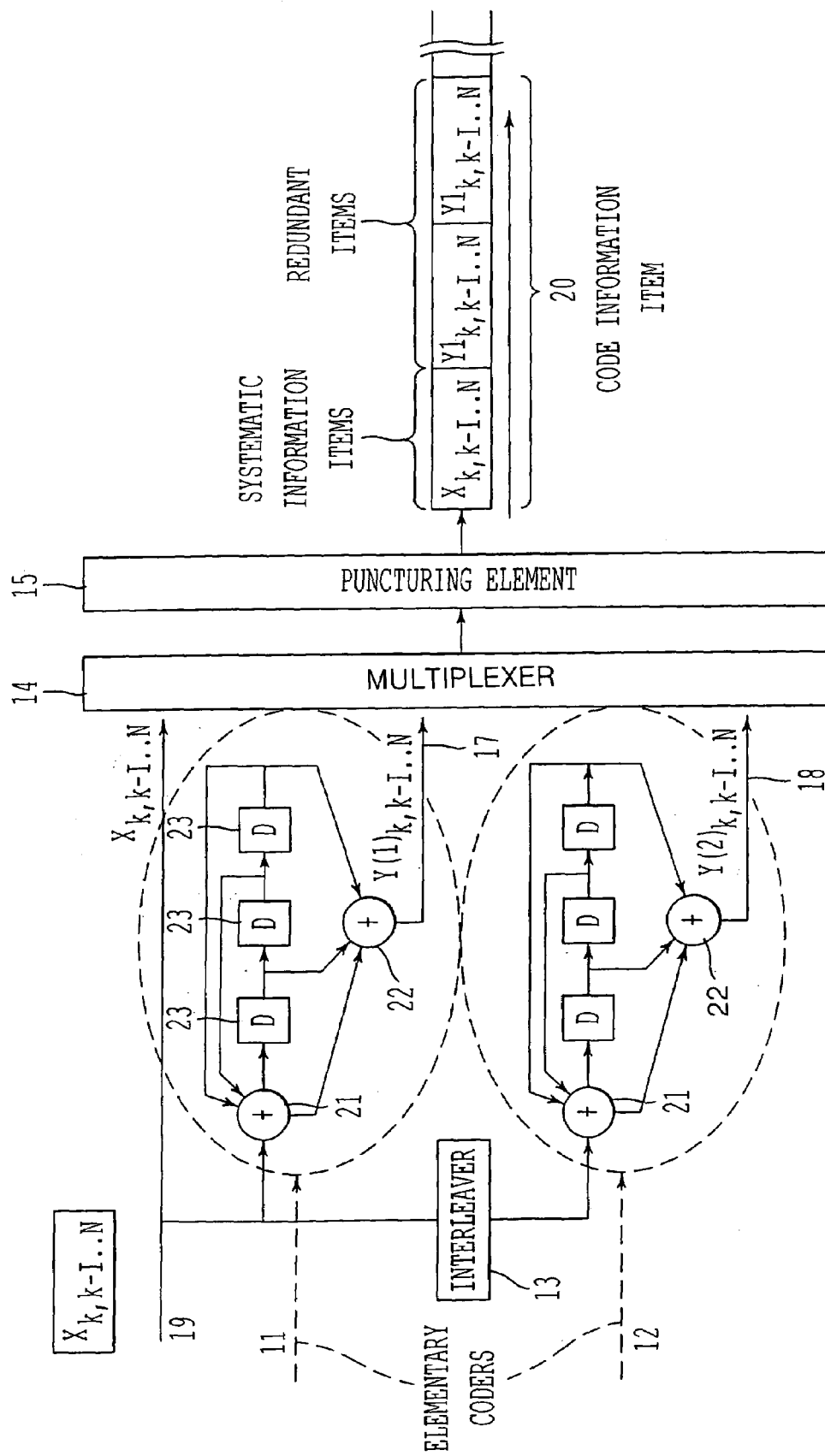
FIG. 1 is a diagram illustrating a coding device with a turbo code of the two-dimensional PCCC type.
Figure 2:
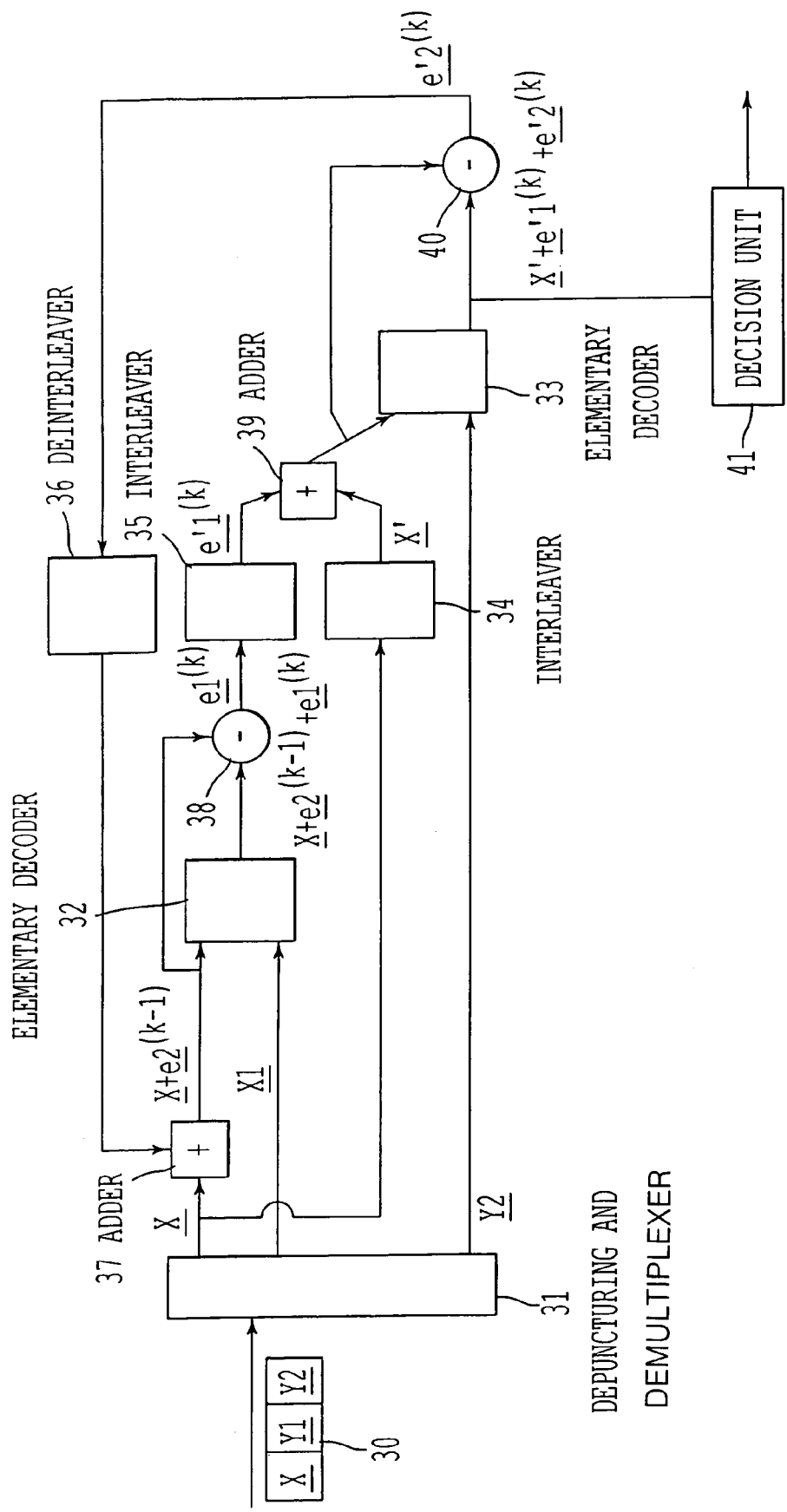
FIG. 2 is a diagram illustrating a decoding device in serial mode associated with the coding device of FIG. 1.

The present invention will be illustrated notably with reference to a transmission method of the error correcting coding type using a turbo code of the two-dimensional PCCC type, a turbo coding device applying this method being depicted schematically in FIG. 1, and a turbo decoding device applying this method being depicted in FIG. 2. The invention can easily be extended to turbo codes of greater dimension, using other types of elementary codes, and/or to different concatenation schemes, notably to serial concatenation schemes, as well as to different turbo decoding concatenation schemes.

Overall, a digital transmission method of the error correcting coding type by PCCC turbo code comprises a coding procedure before a transmission step and a decoding procedure after a transmission step.

The coding procedure is illustrated through the coding device depicted schematically in FIG. 1.

Overall, this coding device 10 comprises two elementary coders 11 and 12 between which there acts an interleaver of size N 13.

Each of the elementary coders 11 and 12 is a coder using a recursive systematic convolutional (RSC) code. As is well known, each of these elementary coders uses a series of auxiliary information items, stored in a device of the shift register type, each obtained by the mathematical combination of a useful information item and auxiliary information items calculated previously. In the example presented here, the shift register 23 stores the auxiliary data calculated by the exclusive OR 21 whose inputs give the first generator polynomial of the RSC coder 11. The convolution product is produced by the exclusive OR 22, the outputs of the register 23 give the second generator polynomial of the RSC coder 11. The useful information item 19 is systematically transmitted alongside redundant information items 17, 18 which appear at the output of the exclusive OR operators 22. The interleaving step 13 of size N modifies the order in which the data are taken into account by each of the elementary codes. In this way, each of the coders 11 and 12 generates a redundant information item which is associated with it. The useful information item is transmitted only once. Thus the coded information item as it appears from the coding procedure is a block 20 comprising the useful information item, or systematic part, and the two redundant information items, or parts of the coded information item corresponding to each of the elementary codes. Naturally, the two elementary codes could be different. After multiplexing 14, the coded information can be subjected to puncturing 15. The efficiency of each of the elementary coders is ½ and, because the systematic part is transmitted only once, the efficiency R of the turbo code is ⅓. This efficiency can of course be increased by puncturing. Thus the puncturing of half of the redundant bits of each elementary code would produce an efficiency R of ½.

The coded information is in the form of sequences of N blocks 20 composed of the systematic information item X and the first and second redundant items Y1 and Y2. After any puncturing, a sequence is transmitted and undergoes the modifications afforded by the channel. It is then received by the decoding device and possibly depunctured. There are then N blocks 30 of length 3 at the input of the demultiplexer 31. Each of these blocks 30 constitutes a received information item to be decoded. They contain a received information part corresponding to the useful information item, referred to as the systematic information item X, a first received information part corresponding to the redundant information of the first elementary code, referred to as the first redundant information item Y1, and a second received information part corresponding to the redundant information item of the second elementary code, referred to as the second redundant information item Y2. The decoding procedure functions by decoding sequences of N bits corresponding to the sequences of N blocks received.

The decoding device, with serial concatenation, comprises an elementary decoder 32 corresponding to the first elementary coder 11 and an elementary decoder 33 corresponding to the second elementary coder 12. In the example considered here, the elementary decoders, using an algorithm of the LogMAP type, have weighted inputs and outputs in the form of log likelihood ratios (LLRs). Because of this, the extrinsic information is initialised to 0 and the extrinsic information is combined with the systematic information by addition. Naturally, if the quantities manipulated by the elementary decoders are others, it will be necessary to make the corresponding changes. For example, if it is a case of likelihood ratios, the extrinsic information is initialised to 1 and the combination is effected by product. If it is a case of probabilities, the extrinsic information is initialised to 0.5 and the combination is also effected by product.

On the one hand, the received information part X corresponding to the useful information is transmitted to the elementary decoders 32 and 33. In the direction of the elementary decoder 32 an adder 37 adds to this systematic information X an extrinsic information item $e2_{k'-1}$. In the direction of the elementary decoder 33, an adder 39 adds to this systematic information X, interleaved by an interleaver 34 of size N corresponding to the interleaver 13, an extrinsic information item $e1_{k'}$, interleaved by an interleaves 35 of size N corresponding to the interleaves 13. Moreover, the received information part Y1 corresponding to the redundant information of the first elementary code is transmitted to the decoder 32 and the received information part Y2 corresponding to the redundant information of the second elementary code is transmitted to the decoder 33.

The index k' represents the current iteration of the decoding procedure, the extrinsic information item $e2_{k'-1}$ being therefore calculated during an iteration preceding the one during which the extrinsic information item $e1_{k'}$ is calculated.

The extrinsic information $e1_{k'}$ is obtained at the output of the elementary decoder 32 during an iteration k', with subtraction, at a subtractor 38, of the systematic information X and the extrinsic information $e2_{k'-1}$.

The extrinsic information $e2_{k'}$ is obtained, in interleaved form $e'2_{k'}$, at the output of the elementary decoder 33 during an iteration k', with subtraction, at a subtractor 40, of the interleaved systematic information X' and the interleaved extrinsic information $e'1_{k'}$. It is deinterleaved by a deinterleaver 36 of size N corresponding to the interleaver 13 before transmission at the following iteration.

At the end of a decoding procedure, a decoding sequence at the output of the second elementary decoder 33 is deinterleaved and analysed by a decision unit 41 in order to form a decoded sequence.

At the start, the extrinsic information $e2_0$ is initialised to 0. During the first iteration, the systematic information X forms the a priori input information of the first elementary decoder 32. The first elementary decoding, as from the first redundant information item Y1, produces a weighted output information item $D1_1$, corresponding to a first decoding sequence estimation, and written in the form of a combination of the systematic information and the extrinsic information $e1_1$, the latter corresponding to an increase in the reliability associated with the first elementary decoding. $D1_1=X+e1_1$, the extrinsic information $e1_1$ being written as the difference between the weighted output information of the first decoder, here the output log likelihood ratio, and the weighted input information of the first decoder, here the input log likelihood ratio. This extrinsic information $e1_1$, interleaved and added to the interleaved systematic information X', forms the a priori input information of the second elementary decoder 33. The second elementary decoding, from the second redundant information item Y2, produces a weighted output information item $D'2_1$, which corresponds to a second decoding sequence estimation, and which is written in the form of a combination of the interleaved systematic information, the interleaved extrinsic information $e'1_1$ and the interleaved extrinsic information $e'2_1$, the latter corresponding to an increase in the reliability associated with the second elementary decoding. $D'2_1=X'+e'1_1+e'2_1$, the interleaved extrinsic information $e'2_1$ being written as the difference between the weighted output information of the second decoder, here the output log likelihood ratio, and the weighted input information of the second decoder, here the input log likelihood ratio. The interleaved extrinsic information $e'2_1$ forms, after deinterleaving, the extrinsic information $e2_1$ which, added to the systematic information X, forms the input a priori information of the first elementary decoder 32 for the second iteration. The elementary decoding, still from the first redundant information item Y1, then produces a weighted output information item $D1_2$, which corresponds to a new decoding sequence estimation of increased reliability. A new extrinsic information item associated with the decoder 32 $e1_2$, interleaved and added to the interleaved systematic information X', forms the a priori input information of the second elementary decoder 33. The second elementary decoding, still from the second redundant information item Y2, produces a weighted output information item $D'2_2$, which corresponds to yet another new decoding sequence estimation of increased reliability. A new extrinsic information item associated with the decoder 33 $e2_2$, added to the systematic information X, forms the a priori input information of the first elementary decoder 32 for the third iteration. The process then continues in the same way, the extrinsic information, as the iterations progress, gaining in reliability, that is to say in amplitude in the present case where it is expressed in terms of likelihood ratio logarithm. At the end of the decoding procedure, after a number of iterations k whose determination will be explained below, the interleaved decoding sequence composed of the weighted output information items $D'2_k$ at the output of the second elementary decoder 33 is deinterleaved and thresholded in order to produce the decoded sequence.

Figure 4:
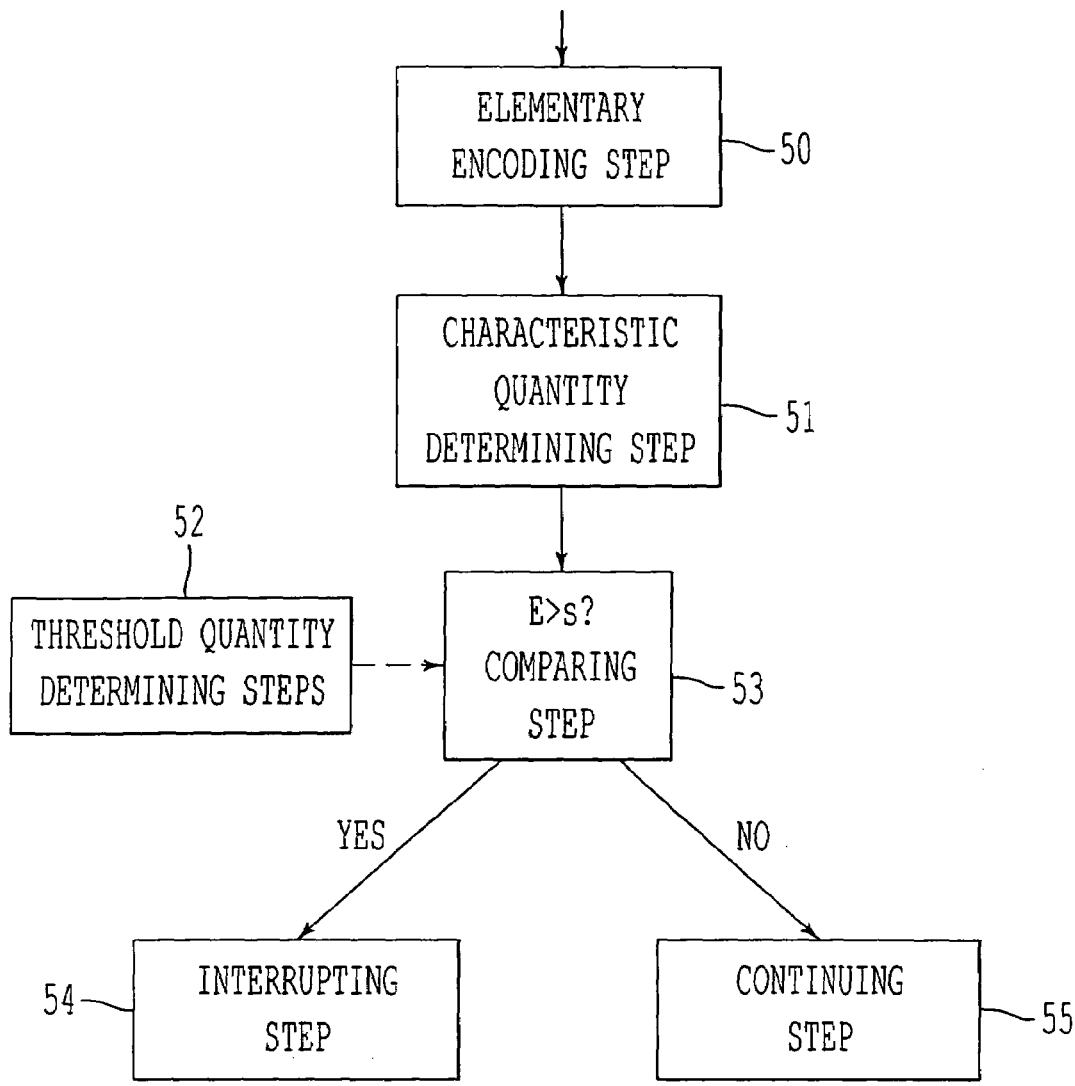
FIG. 4 is a flow diagram illustrating a basic principle of a decoding procedure with interrupt criterion according to one embodiment of the present invention.

FIG. 4 depicts an embodiment of the present invention applied to the case of an i-dimensional PCCC such as the two-dimensional PCCC which has just been described.

Overall, according to the invention, a characteristic quantity determining step 51 and a comparing step 53 adapted to compare the characteristic quantity with a threshold quantity are associated with each of the elementary decoding steps 50 of an iterative decoding procedure. The threshold quantity is determined by a threshold quantity determining step, 52. During the elementary decoding step 50, the characteristic quantity determination step is adapted to calculate a characteristic quantity of the sequence of N extrinsic information items at the output of the elementary decoding step 50. An interrupting step 54 will interrupt the decoding procedure if the characteristic quantity reaches and exceeds the threshold quantity. If not, through the continuing step 55, the decoding procedure will continue to the following elementary decoding step.

More precisely, the characteristic quantity determination step 51 executes an algorithm consisting, during an $i^{th}$ step of elementary decoding of a $k^{th}$ iteration, of calculating the mean $E|ei'_k|$ of the absolute value of the extrinsic information calculated on the sequence of N extrinsic values at the output of the $i^{th}$ decoder during the $k^{th}$ iteration. Advantageously, this characteristic quantity is determined for each elementary decoding, step so that the iterative decoding method can be interrupted including at an elementary decoding step situated in the body of the iteration. Alternatively, this characteristic quantity may be calculated only for certain elementary decoding steps, for example for the last elementary decoding step in each iteration.

Thus, in the case of the 2-dimensional PCCC described, this characteristic quantity determination step 51 determines, for example, during the elementary decoding effected by the second decoder 33 during a $k'^{th}$ iteration, the mean $Ele2_{k'}$ of the absolute value of the extrinsic information calculated on the sequence of N extrinsic values and the output of the second decoder 33 during this $k'^{th}$ iteration.

Once the characteristic quantity $Elei'_{k'}|$ has been determined, at the end of the $i'^{th}$ elementary decoding step of the $k'^{th}$ iteration, the comparison step 53 receives on the one hand this characteristic quantity $Elei'_{k'}|$ and on the other hand a threshold quantity s determined by the threshold quantity determination step 52. If the step 53 determines that $Elei'_{k'}|>s$, step 54 is executed and the iterative decoding procedure is interrupted at the elementary decoding step i' of the iteration k'. In this case, the sequence of N weighted output information items associated with the sequence of N information items decoded by the decoding procedure is the sequence of N weighted output information items generated by the $i'^{th}$ elementary decoder during the $k'^{th}$ iteration. If step 53 determines that $Elei'_{k'}|$ is not greater than s, step 55 is executed and the iterative decoding procedure continues, the interrupt test then being applied at the end of the following elementary decoding step, and so on.

The threshold quantity determination step 52 determines a threshold quantity s as a function of configuration parameters. It may be case of parameters characterising the transmission conditions such as, for example, the signal to noise ratio. It may also be a case of parameters characterising, for example, the size of the useful information block, an elementary decoding algorithm, a type of quantity used, a maximum number of iterations, a type of transmission channel, etc. These configuration parameters characterise the current decoding operation.

The choice of the threshold quantity will also depend on the application in the context of which the numerical transmission method acts. Thus the threshold value will often have to be chosen so as to effect a compromise between the performance permitted by the decoding procedure and the complexity of this decoding procedure. In the same way, it may be chosen as a function of a mean transmission time required or as a function of a mean energy consumption acceptable.

In the present example embodiment, a maximum tolerable number of iterations having been predefined, the threshold s is fixed by combining two quantities calculated in the same way as the characteristic quantity according to the present invention is calculated, that is to say, in the present case, by taking the mean of the amplitudes of N extrinsic information items of a decoding sequence. These two quantities are peculiar to a given configuration as defined by the configuration parameters and corresponding to the current decoding operation. The first and second quantities characterise, in this given configuration, a set of extrinsic information items generated by a last elementary decoder, at the end of the decoding procedure which executed the maximum predefined number of iterations, respectively in the case of a decoding without error and in the case of a decoding for which errors remain.

Advantageously, these first and second quantities are obtained as a function of the configuration parameters by means of an adaptive algorithm or a pre-established reference table, based on a prior study of the evolution of the characteristic quantity D according to the invention, here the mean of the amplitudes of N extrinsic information items of a decoding sequence, as a function of the configuration parameters.

Figure 3:
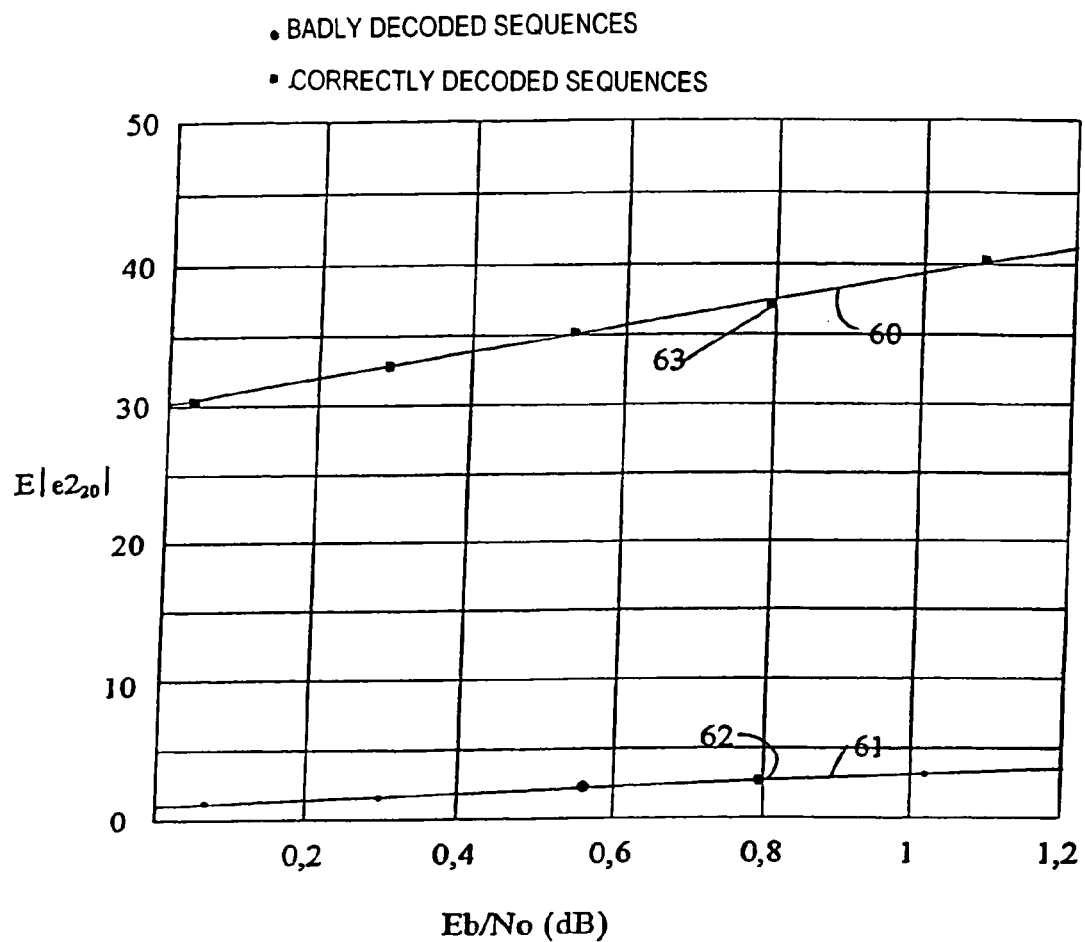
FIG. 3 is a graph showing, as a function of the signal to noise ratio, the mean of the absolute value of the extrinsic information calculated at the output of a last decoder of a last iteration, on the one hand for correctly decoded sequences, and on the other hand for sequences exhibiting residual errors.

By way of example, FIG. 3 shows, in the form of a graph, a result of such a study for the PCCC of the present embodiment. The two curves 61 and 60 give the mean $Ele2_{20}|$ of the absolute value of the extrinsic information and the output of the $2^{nd}$ decoder of the $20^{th}$ iteration as a function of the signal to noise ratio Eb/No, respectively in the case of badly decoded sequences, that is to say those which still contain errors, and in the case of correctly decoded sequences, that is to say ones which contain no residual error. The values $Ele2_{20}|$ have been calculated, in both cases and for each signal to noise ratio value, for sufficient sequences to obtain usable curves. In the present example, the length of the decoding sequence (corresponding to the size of the interleavers) is N=640. The signal at the output of the turbo coder is moderated by a BPSK modulation and transmitted over a white additive Gaussian noise (WAGN) channel.

The curves obtained, used for example by means of a reference table, make it possible, for a given signal to noise ratio, forming a configuration parameter, to deduce the first and second quantities, combining which gives the threshold quantity s.

For example, for a signal to noise ratio of 0.78 dB and a maximum number of iterations fixed at 20, the first quantity, characterising a decoding without error, is equal to 37.5 (point 63) and the second quantity, characterising a decoding with residual errors, is equal to 3 (point 62).

Naturally, the threshold quantity determination step can be based on a plurality of characteristic curves, such as those depicted in FIG. 3, corresponding to a plurality of configuration parameters.

In order to be able to adapt the threshold quantity with a view, for example, to making a compromise between the performance permitted by the decoding procedure and the complexity of this decoding procedure, or as a function, for example, of a required mean transmission time, or an acceptable mean energy consumption, the determination of the threshold quantity by combining a first quantity, characterising a decoding without error, and a second quantity, characterising a decoding with residual errors, is effected by means of a coefficient α making it possible to favour one or other of these quantities.

In the present example embodiment, the threshold quantity is the sum of the first quantity multiplied by a coefficient α and of the second quantity multiplied by a coefficient (1−α), the coefficient α being chosen between 0 and 1.

The coefficient α is determined, for example by means of an adaptive algorithm or a reference table, as a function of the application in the context of which the digital transmission method acts. The smaller α is, the lower are the mean complexity of the decoding, the mean decoding time and the mean energy consumption for the decoding of a sequence. The larger α is, the more improved are the performances permitted by the decoding. Thus, for example, for applications able to tolerate relatively high binary or packet error rates but requiring low transmission times, as is the case with voice services, the parameter α is rather chosen so as to be small. For such applications, the maximum number of iterations is also small. On the other hand, for applications requiring low binary or packet error rates but tolerating high transmission times, as is the case with data transfer services, the parameter α and the maximum number of iterations are rather chosen so as to be great.

For example, in the example of FIG. 3, for a signal to noise ratio of 0.78 dB, a coefficient α equal to 0.35 gives a threshold quantity s equal to 15. If a procedure for the iterative decoding of a sequence is interrupted when the characteristic quantity calculated for this sequence attains the threshold quantity s=15, the performance in terms of bit error rates is not or is only slightly degraded compared with the case where the decoding procedure goes to the end of its twenty iterations. On the other hand, the mean number of iterations effected is 3.8 instead of 20, which results in a saving in complexity greater than 5.

The present invention applies to all types of transmission method using an error correcting code of the turbo coding type, whether it is a case of a serial or parallel turbo coding, or even a turbo code with a hybrid concatenation scheme mixing serial concatenation and parallel concatenation.

One embodiment of the present invention applied to a serial turbo code will be presented briefly.

For example, in a serial concatenation turbo code, each elementary coder generates an elementary coded information item from the elementary coded information item issuing from the previous elementary coders, the i elementary coders being separated by (i−1) interleavers. Puncturing steps can be distributed in the coding procedure, the output of a $j^{th}$ coder being able to be punctured by a $j^{th}$ puncturing vector, interleaved by a $j^{th}$ interleaver before coding by a $(j+1)^{th}$ coder. The size of each interleaver depends on the previous coding step and, in particular, on the efficiency after puncturing of the previous elementary coder.

In an example of turbo decoding corresponding to the serial concatenation turbo coding which has just been described, the elementary decoders being associated in the reverse order of the elementary coders, each elementary decoding step receives two a priori weighted information items, one, referred to as the first input information item, corresponding to the output information item of the corresponding elementary coder, and the other, referred to as the second input information item, corresponding to the input information item of the corresponding elementary coder. This elementary decoding step produces two a posteriori weighted information items, one, referred to as the first output information item, corresponding to the output of the corresponding elementary coder, and which therefore becomes, during a following iteration, after interleaving and corresponding puncturing, the a priori input of a previous elementary decoder, and the other, referred to as the second output information item, corresponding to the input of the corresponding elementary coder, and which therefore becomes, in the same iteration, after deinterleaving and corresponding depuncturing, the a priori input of a following elementary decoder. The first input information item corresponds to the information to be decoded by the elementary decoding step. The second output information corresponds to the information decoded by the elementary decoding step, and consists of the combination of the second input information item and an extrinsic information item.

According to the present invention, the characteristic quantity determination step calculates, during an elementary decoding step, a characteristic quantity from a set of extrinsic information items at the output of this elementary decoding step. For example, if reference is made to the previously described turbo decoding example, the characteristic quantity calculation is made using a set of extrinsic information items issuing from a set of second output information items.

The invention claimed is:

1. Digital transmission method comprising:
coding, from a useful information item, a coded information item comprising the useful information item and at least one redundant information item,
transmitting said coded information item over a channel after said coding,
receiving said coded information item,
decoding to obtain, from the received coded information item, an estimation of said useful information item with correction of transmission errors based on said at least one redundant information item,
said coding comprises a plurality of elementary coding steps which operate in parallel or in series and are associated with at least one interleaving step,
said decoding is iterative and comprises, for each iteration, a plurality of elementary decoding steps associated with interleaving and deinterleaving steps, corresponding to said plurality of elementary coding steps associated with said at least one interleaving step, each of said elementary decoding steps receives a set of information to be decoded and generates a respective set of weighted output information items,
determining a threshold quantity characteristic of said decoding as a function of one or more configuration parameters using an adaptive algorithm,
generating a characteristic quantity from each set of said weighted output information items generated by each of said elementary decoding steps during each iteration that is characteristic of said set of weighted output information items,
comparing said characteristic quantity with said threshold quantity, and
interrupting said decoding when said characteristic quantity reaches said threshold quantity.

2. Digital transmission method according to claim 1, wherein said generating step comprises:
calculating a quantity characteristic of a set of extrinsic information.

3. Digital transmission method according to claim 1 wherein said generating step comprises:
calculating a statistical quantity characterizing each set of said set of weighted output information items.

4. Digital transmission method according to claim 3, wherein said generating step comprises:
calculating a mean of an absolute value of each set of said set of weighted output information items generated by each of said elementary decoding steps within each iteration.

5. Digital transmission method according to claim 3, wherein said interrupting step comprises:
interrupting said decoding when said characteristic quantity is greater than said threshold quantity.

6. Digital transmission method according to claim 1, wherein said determining step comprises:
determining said threshold quantity as a function of at least one configuration parameters including signal to noise ratio, size of a useful information block, elementary decoding algorithm, maximum number of iterations, and the transmission channel.

7. Digital transmission method according to claim 1, wherein said determining step comprises:
using a pre-established reference table to select said threshold quantity as a function of one or more configuration parameters.

8. Digital transmission method according claim 1, wherein said determining step comprises:
selecting said threshold quantity based at least in part on a performance permitted by said decoding and a complexity of this decoding.

9. Digital transmission method according to claim 1, wherein said determining step comprises:
determining said threshold quantity as a function of a required mean transmission time.

10. Digital transmission method according claim 1, wherein said determining step comprises:
  determining said threshold quantity as a function of a mean energy consumption.

11. Digital transmission method according to claim 1, wherein said decoding step comprises:
  having inputs and outputs of said elementary decoding steps which are weighted, in terms of probabilities, likelihood ratios or log likelihood ratios.

12. Digital transmission method according to claim 1 wherein said coding step comprises at least one puncturing step and said decoding step comprises at least one corresponding depuncturing step.

13. Digital transmission method comprising:
  coding, from a useful information item, a coded information item comprising the useful information item and at least one redundant information item,
  transmitting said coded information item over a channel after said coding,
  receiving said coded information item,
  decoding to obtain, from the received coded information item, an estimation of said useful information item with correction of transmission errors based on said at least one redundant information item,
  said coding comprises a plurality of elementary coding steps which operate in parallel or in series and are associated with at least one interleaving step,
  said decoding is iterative and comprises, for each iteration, a plurality of elementary decoding steps associated with interleaving and deinterleaving steps, corresponding to said plurality of elementary coding steps associated with said at least one interleaving step, each of said elementary decoding steps receives a set of information to be decoded and generates a respective set of weighted output information items,
  determining a threshold quantity characteristic of said decoding as a function of one or more configuration parameters,
  generating a characteristic quantity from each set of said weighted output information items generated by each of said elementary decoding steps during each iteration that is characteristic of said set of weighted output information items,
  comparing said characteristic quantity with said threshold quantity, and
  interrupting said decoding when said characteristic quantity reaches said threshold quantity,
  wherein determining step comprises:
    predefining a maximum number of iterations; and
    combining a first quantity characteristic of a first set of weighted output information items generated by a last elementary decoder during a last iteration and associated with a first set of decoded information items corresponding to an error-free decoding of a set of information items to be decoded, and a second quantity characteristic of a second set of weighted output information items generated by said last decoder during said last iteration and associated with a second set of decoded information items corresponding to the decoding of said set of information items to be decoded in a case where errors remain.

14. Digital transmission method according to claim 13, wherein said combining step comprises:
  calculating said first quantity characteristic and said second quantity characteristic based on statistical quantities characteristic of said first set of weighted output information items and of said second set of weighted output information items, respectively.

15. Digital transmission method according to claim 13, wherein said combining step comprises:
  calculating said first quantity characteristic and said second quantity characteristic that are a mean of an absolute value of said first set of weighted output information items and a mean of an absolute value of said second set of weighted output information items respectively.

16. Digital transmission method according to claim 13, wherein said combining step comprises:
  calculating using an adaptive algorithm said first quantity characteristic and said second quantity characteristic as a function of at least one configuration parameter.

17. Digital transmission method according to claim 13, wherein said first and second quantity characteristics are a function of at least one configuration parameter.

18. Digital transmission method according to claim 13, wherein said combining step comprises:
  using a pre-established reference table to determine said first quantity characteristic and said second quantity characteristic as a function of at least one configuration parameter.

19. Digital transmission method according to claim 13, wherein said determining step comprises:
  summing said first quantity characteristic multiplied by a coefficient $\alpha$ and said second quantity characteristic multiplied by a coefficient $(1-\alpha)$, the coefficient $\alpha$ being chosen between 0 and 1.

20. Digital transmission method according to claim 19, wherein said summing step comprises:
  choosing said coefficient $\alpha$ based at least in part on performance permitted by said decoding and complexity of said decoding.

21. Digital transmission method according to claim 19, wherein said summing step comprises:
  choosing said coefficient $\alpha$ as a function of a required mean transmission time.

22. Digital transmission method according to claim 19, wherein said summing step comprises:
  choosing said coefficient $\alpha$ as a function of a mean energy consumption.

23. Digital transmission method according to claim 19, wherein said summing step comprises:
  determining said coefficient $\alpha$ using an adaptive algorithm.

24. Digital transmission method according to claim 19, wherein said summing step comprises:
  determining said coefficient $\alpha$ using a pre-established reference table.

* * * * *